US010191380B2

(12) United States Patent
Yamamoto et al.

(10) Patent No.: US 10,191,380 B2
(45) Date of Patent: Jan. 29, 2019

(54) COMPOSITION FOR RESIST PATTERNING AND METHOD FOR FORMING PATTERN USING SAME

(71) Applicant: AZ Electronic Materials (Luxembourg) S.a.r.l., Luxembourg (LU)

(72) Inventors: Kazuma Yamamoto, Kakegawa (JP); Tatsuro Nagahara, Kakegawa (JP)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 0 days.

(21) Appl. No.: 15/519,044

(22) PCT Filed: Oct. 13, 2015

(86) PCT No.: PCT/JP2015/078931
§ 371 (c)(1),
(2) Date: Apr. 13, 2017

(87) PCT Pub. No.: WO2016/060116
PCT Pub. Date: Apr. 21, 2016

(65) Prior Publication Data
US 2017/0219927 A1    Aug. 3, 2017

(30) Foreign Application Priority Data
Oct. 14, 2014   (JP) .................. 2014-210049

(51) Int. Cl.
| G03F 7/004 | (2006.01) |
| G03F 7/42 | (2006.01) |
| C11D 11/00 | (2006.01) |
| H01L 21/02 | (2006.01) |
| G03F 7/40 | (2006.01) |
| H01L 21/027 | (2006.01) |
| G03F 7/038 | (2006.01) |
| G03F 7/039 | (2006.01) |
| G03F 7/16 | (2006.01) |
| G03F 7/20 | (2006.01) |
| G03F 7/32 | (2006.01) |
| G03F 7/38 | (2006.01) |

(52) U.S. Cl.
CPC .......... *G03F 7/425* (2013.01); *C11D 11/0047* (2013.01); *G03F 7/038* (2013.01); *G03F 7/039* (2013.01); *G03F 7/162* (2013.01); *G03F 7/168* (2013.01); *G03F 7/20* (2013.01); *G03F 7/322* (2013.01); *G03F 7/38* (2013.01); *G03F 7/40* (2013.01); *G03F 7/426* (2013.01); *H01L 21/0206* (2013.01); *H01L 21/027* (2013.01); *H01L 21/0274* (2013.01)

(58) Field of Classification Search
CPC . G03F 7/004; G03F 7/42; G03F 7/425; G03F 7/426; G03F 7/40; C11D 11/0047; H01L 21/0274; H01L 21/0206
USPC ........................................ 430/331; 510/176
See application file for complete search history.

(56) References Cited

U.S. PATENT DOCUMENTS

| 7,199,091 | B2 | 4/2007 | Takashima |
| 7,399,582 | B2 | 7/2008 | Takahashi et al. |
| 8,841,060 | B2 | 9/2014 | Kataoka et al. |
| 8,841,061 | B2 | 9/2014 | Hatakeyama et al. |
| 9,034,810 | B2 | 5/2015 | Mizuta et al. |
| 9,411,232 | B2 | 8/2016 | Nagahara et al. |
| 2010/0119975 | A1 | 5/2010 | Akashi et al. |
| 2012/0181248 | A1* | 7/2012 | Park ................. G03F 7/425 216/13 |
| 2014/0100157 | A1* | 4/2014 | Wilcox .............. A61K 38/14 514/2.9 |
| 2014/0234759 | A1 | 8/2014 | Kataoka et al. |
| 2016/0152930 | A1* | 6/2016 | Egbe .................. G03F 7/422 510/176 |
| 2016/0179011 | A1* | 6/2016 | Agarwal ............. C11D 7/261 510/176 |
| 2016/0186106 | A1* | 6/2016 | Du ................... C11D 11/0047 510/176 |
| 2016/0254164 | A1* | 9/2016 | Sugishima ....... H01L 21/31133 438/745 |

FOREIGN PATENT DOCUMENTS

JP          2010250118 A       11/2010

OTHER PUBLICATIONS

Machine translation of JP 2010-250118 (no date).*
International Search Report for PCT/JP2015/078931 dated Dec. 28, 2015.
Written Opinion of the International Searching Authority for PCT/JP2015/078931 dated Dec. 28, 2015.

* cited by examiner

*Primary Examiner* — Amanda C. Walke
(74) *Attorney, Agent, or Firm* — Drinker Biddle & Reath LLP

(57) ABSTRACT

[Problem]
To provide a composition capable of improving surface roughness of resist patterns, and also to provide a pattern formation method employing the composition.
[Solution]
The present invention provides a composition containing a particular nitrogen-containing compound, an anionic surfactant having a sulfo group, and water; and also provides a pattern formation method containing a step of applying the composition to a resist pattern beforehand developed and dried.

14 Claims, No Drawings

COMPOSITION FOR RESIST PATTERNING AND METHOD FOR FORMING PATTERN USING SAME

CROSS-REFERENCE TO RELATED APPLICATIONS

This application is a national stage application (under 35 U.S.C. § 371) of PCT/JP2015/078931, filed Oct. 13, 2015, which claims benefit of Japanese Application No. 2014-210049, filed Oct. 14, 2014, both of which are incorporated herein by reference in their entirety.

TECHNICAL FIELD

The present invention relates to a resist pattern treatment composition with which resist patterns obtained by development is treated in semiconductor production processes. Specifically, this invention relates to a resist pattern treatment composition which is applied to resist patterns formed in lithographic processes for manufacturing semiconductor devices, flat panel displays (FPDs) such as liquid crystal displays, and color filters, so as to improve the pattern shapes; and the invention further relates to a pattern formation method employing that composition.

BACKGROUND ART

Photolithography has hitherto been adopted for formation of fine elements or for microfabrication in extensive fields including the manufacture of semiconductor integrated circuits such as LSIs, the preparation of FPD screens, and the production of circuit boards for color filters, thermal heads and the like. In photolithographic processes, positive- or negative-type photosensitive resin compositions are used for resist pattern formation. Those photosensitive resin compositions include positive-type photoresists, such as, a resin composition comprising an alkali-soluble resin and a quinonediazide compound serving as a photosensitive substance. This photosensitive resin composition is commonly employed.

Meanwhile, in recent years, LSIs have been required to be high integration and accordingly resist patterns have been required to be miniaturized. In order to meet the requirement, it is becoming practicable to carry out lithographic processes by use of short-wavelength radiation, such as, KrF excimer laser light (wavelength: 248 nm), ArF excimer laser light (wavelength: 193 nm), extreme ultraviolet light (EUV, wavelength: 13 nm), X-rays or electron beams (EB). In accordance with the miniaturization of patterns, photosensitive resin compositions serving as photoresists in microfabrication are now required to provide patterns with high resolution. Further, they are also required to be improved in other properties, for example, sensitivity, pattern shapes and dimensional accuracy of images, as well as, for the resolution. In view of that, a "chemically amplified photosensitive resin composition" is proposed as a high-resolution radiation-sensitive resin composition having sensitivity to short-wavelength radiation. The chemically amplified photosensitive resin composition contains a compound which generates an acid when exposed to radiation. Accordingly, when exposed to radiation, the acid-generating compound releases an acid and the acid works catalytically to form an image with high sensitivity. Since the advantage of high sensitivity, the chemically amplified photosensitive resin composition is now taking the place of conventional ones and becoming widely used.

However, in accordance with the recent miniaturization of patterns, there is tendency of increasing serious problems, such as, pattern collapse and pattern roughness (line width roughness: LWR, line edge roughness: LER). For the purpose of coping with those problems, it is proposed, for example, to improve the resin compositions by changing the components (Patent documents 1 and 2). Although LER can be improved by the methods disclosed in those documents, it is desired to make further improvement according to further demands for miniaturization.

PRIOR ART DOCUMENTS

Patent Documents

[Patent document 1] Japanese Patent Laid-Open No. 2013-080032
[Patent document 2] Japanese Patent Laid-Open No. 2013-076946
[Patent document 3] Japanese Patent Laid-Open No. 2013-015596

DISCLOSURE OF INVENTION

Problem to be Solved by the Invention

In order to solve the above technical problems, the present invention aims to improve pattern roughness of a resist pattern formed by photolithography and thereby to provide a further minute and accurate resist pattern having an excellent shape.

Means for Solving Problem

The resist pattern treatment composition according to the present invention is characterized by comprising:
(A) a nitrogen-containing compound showing basicity when dissolved in water and also having a boiling point of 48° C. or more,
(B) an anionic surfactant having a sulfo or carboxyl group, and
(C) water.

Also, the pattern formation method according to the present invention is characterized by comprising the steps of:
(1) coating a substrate with a photosensitive resin composition to form a photosensitive resin composition layer,
(2) exposing said photosensitive resin composition layer,
(3) developing the exposed photosensitive resin composition layer with a developer, and
(4) treating the surface of the resist pattern with the above resist pattern treatment composition.

Effect of the Invention

The resist pattern treatment composition of the present invention makes it possible to improve edge roughness (LWR or LER) of a miniaturized resist pattern, particularly, a resist pattern formed from a resist composition for ArF or extreme ultraviolet light, and thereby to form a further minute and accurate resist pattern.

DETAILED DESCRIPTION

Embodiments of the present invention will be explained below in detail.

[Resist Pattern Treatment Composition]

The resist pattern treatment composition according to the present invention comprises a particular nitrogen-containing compound, an anionic surfactant having a sulfo or carboxyl group, and water. This composition is applied to a resist in a pattern formed by lithographic technologies, particularly, after the resist is dried, so as to improve surface roughness thereof. The components contained in the composition will be individually explained below.

(A) Nitrogen-Containing Compound

The nitrogen-containing compound used in the present invention is characterized by showing basicity when dissolved in water and also by having a boiling point of 48° C. or more.

The nitrogen-containing compound in the present invention contains a nitrogen atom which is often included in a basic group, such as, amino or ammonium group. Accordingly, mostly the nitrogen-containing compound is a basic compound if containing no strong acid group together. The compound preferably does not contain such a strong acid group (e.g., sulfo group) as to cancel out the basicity. The "showing basicity when dissolved in water" in the present invention means concretely that the pH value of the aqueous solution is more than 7 at 22° C.

The nitrogen-containing compound in the present invention also has a boiling point of 48° C. or more. If having a low boiling point, the compound may evaporate, for example, in a coating step, and consequently may fail to provide the effect sufficiently. The boiling point of the nitrogen-containing compound is preferably 50° C. or more, and further preferably 53° C. or more.

There are no particular restrictions on the nitrogen-containing compound used in the present invention as long as it shows basicity when dissolved in water and also has a certain boiling point or more. The compound is preferably represented by the following formula (1), (2) or (3): that is,

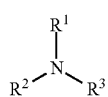

(1)

in which each of $R^1$, $R^2$ and $R^3$ is independently hydrogen or a saturated or unsaturated hydrocarbon chain of 1 to 10 carbon atoms, provided that hydrogens connected to carbon atoms constituting said hydrocarbon chain is replaced or not replaced with —OH, —F, =O or —$NH_2$, said hydrocarbon chain contains or does not contain —(CO)—, —(COO)—, —(CONH)—, —O—, —NH— or —N= at a mid-chain position, two of $R^1$, $R^2$ and $R^3$ are connected or not connected to each other to form a cyclic structure, one terminal of $R^1$, $R^2$ or $R^3$ is connected or not connected to the main chain of a polymer having 20000 or less carbon atoms, and total number of carbon atoms contained in $R^1$, $R^2$ and $R^3$ is three or more;

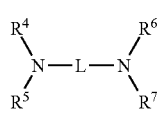

(2)

in which each of $R^4$, $R^5$, $R^6$ and $R^7$ is independently hydrogen or a saturated or unsaturated hydrocarbon chain of 1 to 10, preferably 1 to 4 carbon atoms, provided that hydrogens connected to carbon atoms constituting said hydrocarbon chain is replaced or not replaced with —OH, —F, =O or —$NH_2$, said hydrocarbon chain contains or does not contain —(CO)—, —(COO)—, —(CONH)—, —O—, —NH— or —N= at a mid-chain position, two of $R^4$, $R^5$, $R^6$ and $R^7$ are connected or not connected to each other to form a cyclic structure, preferably all of $R^4$, $R^5$, $R^6$ and $R^7$ are not hydrogens at the same time, more preferably three or more of $R^4$, $R^5$, $R^6$ and $R^7$ are hydrocarbon chains, most preferably all of $R^4$, $R^5$, $R^6$ and $R^7$ are hydrocarbon chains, and L is a hydrocarbon chain of 1 to 10, preferably 1 to 6, particularly preferably 1 to 4 carbon atoms; or

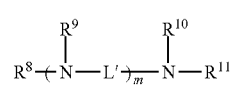

(3)

in which each of $R^8$, $R^9$, $R^{10}$ and $R^{11}$ is independently hydrogen or a saturated or unsaturated hydrocarbon chain of 1 to 10 carbon atoms, provided that hydrogens connected to carbon atoms constituting said hydrocarbon chain is replaced or not replaced with —OH, —F, =O or —$NH_2$, said hydrocarbon chain contains or does not contain —(CO)—, —(COO)—, —(CONH)—, —O—, —NH— or —N= at a mid-chain position, two of $R^8$, $R^9$, $R^{10}$ and $R^{11}$ is connected or not connected to each other to form a cyclic structure, all of $R^8$, $R^9$, $R^{10}$ and $R^{11}$ are not hydrogens at the same time, L' is a hydrocarbon chain of 1 to 10, preferably 1 to 5 carbon atoms, and m represents the number of the repeating unit and is an integer of 1 to 1000, preferably 1 to 50.

In each of the formulas (1) to (3), any two of $R^2$, $R^3$, $R^4$, $R^5$, $R^6$, $R^7$, $R^8$, $R^9$, $R^{10}$ and $R^{11}$ contained in one molecule are connected or not connected to each other to form a cyclic structure. This means that they form or not form, for example, a piperazine ring, a piperidine ring, a pyridine ring, a pyrazoline ring, a pyrazolidine ring, a pyrroline ring, or a morpholine ring.

Further, in the formula (1), one terminal of $R^1$, $R^2$ or $R^3$ is connected or not connected to the main chain of a polymer. In that case, the nitrogen-containing compound of the formula (1) constitutes a side chain connected to the polymer main chain. The structure of the polymer main chain is not particularly restricted, and hence it can be formed by commonly known polymerization, such as, addition polymerization of vinyl groups, condensation polymerization of acid amides, or dehydration condensation of acid groups. However, if the polymer main chain is excessively long and highly hydrophobic, the water-solubility is so impaired that residues may remain on the pattern surface. Accordingly, the polymer main chain has preferably 20000 or less, more preferably 10000 or less, most preferably 1000 or less carbon atoms.

In each formula, all of $R^1$, $R^2$, $R^3$, $R^4$, $R^5$, $R^6$, $R^7$, $R^8$, $R^9$, $R^{10}$ and $R^{11}$ are preferably not hydrogens at the same time. This means that at least one of $R^1$, $R^2$, $R^3$, $R^4$, $R^5$, $R^6$, $R^7$, $R^8$, $R^9$, $R^{10}$ and $R^{11}$ in each formula is preferably a hydrocarbon chain described above, and it is more preferred for all of them to be hydrocarbon chains.

Preferred examples of the nitrogen-containing compound represented by the formula (1) include:

(i) monoalkylamines, such as, n-propylamine, n-butylamine, i-butylamine, t-butylamine, n-pentylamine, i-pentylamine, 2-methyl-n-butylamine, 2-methyl-i-butylamine, 2-methyl-t-butylamine, and n-hexylamine;

(ii) dialkylamines, such as, diethylamine, di-n-propylamine, di-i-propylamine, methyl-n-propylamine, di-n-butylamine, di-i-butylamine, diethylmethylamine, dimethyl-n-propylamine, and dimethyl-i-propylamine;

(iii) trialkylamines, such as, triethylamine, tri-n-propylamine and tri-i-propylamine;

(iv) alkanolamines, such as, monomethanolamine, monoethanolamine, mono-n-propylamine, mono-i-propanolamine, dimethanolamine, diethanolamine, di-n-butylethanolamine, di-i-butylethanolamine, di-t-butylethanolamine, aminoethylethanolamine, methylethanolamine, methyldiethanolamine, ethylethanolamine, ethyldiethanolamine, n-butylethanolamine, i-butylethanolamine, t-butylethanolamine, diethylisopropanolamine, trimethanolamine, and triethanolamine; and (v) cyclic alkylamines, such as, cyclopentylamine, cyclohexylamine, cycloheptylamine, and cyclohexylethanolamine.

Preferred examples of the nitrogen-containing compound represented by the formula (2) include:
N,N,N',N'-tetramethylethylenediamine
N,N,N',N'-tetraethylethylenediamine
N,N,N',N'-tetrapropylethylenediamine,
N,N,N',N'-tetraisopropylethylenediamine
N,N,N',N'-tetrabutylethylenediamine,
N,N,N',N'-tetraisobutylethylenediamine,
N,N,N',N'-tetramethyl-1,2-propylenediamine
N,N,N',N'-tetraethyl-1,2-propylenediamine,
N,N,N',N'-tetrapropyl-1,2-propylenediamine,
N,N,N',N'-tetraisopropyl-1,2-propylenediamine,
N,N,N'N'-tetrabutyl-1,2-propylenediamine,
N,N,N',N'-tetraisobutyl-1,2-propylenediamine,
N,N,N',N'-tetramethyl-1,3-propylenediamine,
N,N,N',N'-tetraethyl-1,3-propylenediamine,
N,N,N',N'-tetrapropyl-1,3-propylenediamine,
N,N,N',N'-tetraisopropyl-1,3-propylenediamine,
N,N,N',N'-tetrabutyl-1,3-propylenediamine,
N,N,N',N'-tetraisobutyl-1,3-propylenediamine,
N,N,N',N'-tetramethyl-1,2-butylenediamine,
N,N,N',N'-tetraethyl-1,2-butylenediamine,
N,N,N',N'-tetrapropyl-1,2-butylenediamine,
N,N,N',N'-tetraisopropyl-1,2-butylenediamine,
N,N,N',N'-tetrabutyl-1,2-butylenediamine,
N,N,N',N'-tetraisobutyl-1,2-butylenediamine,
N,N,N',N'-tetramethyl-1,3-butylenediamine,
N,N,N',N'-tetraethyl-1,3-butylenediamine,
N,N,N',N'-tetrapropyl-1,3-butylenediamine,
N,N,N',N'-tetraisopropyl-1,3-butylenediamine,
N,N,N',N'-tetrabutyl-1,3-butylenediamine,
N,N,N',N'-tetraisobutyl-1,3-butylenediamine,
N,N,N',N'-tetramethyl-1,4-butylenediamine,
N,N,N',N'-tetraethyl-1,4-butylenediamine,
N,N,N',N'-tetrapropyl-1,4-butylenediamine,
N,N,N',N'-tetraisopropyl-1,4-butylenediamine,
N,N,N',N'-tetrabutyl-1,4-butylenediamine,
N,N,N',N'-tetraisobutyl-1,4-butylenediamine,
N,N,N',N'-tetramethyl-1,5-pentylenediamine,
N,N,N',N'-tetraethyl-1,5-pentylenediamine,
N,N,N',N'-tetramethyl-1,6-hexylenediamine,
N,N,N',N'-tetraethyl-1,6-hexylenediamine,
N,N-dimethylaminoethylamine,
N,N-diethylaminoethylamine,
N,N-dimethylaminopropylamine,
N,N-diethylaminopropylamine,
N-methylaminoethylamine,
N-ethylaminoethylamine,
1,2-diaminopropane, and
1,3-diaminopropane.

Examples of the nitrogen-containing compound preferably used in the present invention include compounds represented by the following formulas (a1) to (a6):

(a1)

(a2)

(a3)

(a4)

(a5)

(a6)

in which each R' is independently hydrogen or a saturated or unsaturated hydrocarbon chain of 1 to 10 carbon atoms, provided that hydrogens connected to carbon atoms constituting said hydrocarbon chain may be replaced with —OH, —F, =O or —NH$_2$. Each R' is preferably, for example, methyl, ethyl, methoxy, ethoxy or trifluoromethyl group.

In each formula, x is the number of substituent groups connected to the ring and n is 1 or 2. This means that the cyclic structure in the formula (a4) or (a5) is a five- or six-membered ring. The minimum of x is 0 and the maximum of x depends on the size of the ring and other substituent groups.

Preferred examples of the nitrogen-containing compound represented by the above formulas include:

piperazine, hydroxyethylpiperazine, methylpiperazine, dimethylpiperazine, ethylpiperazine, imidazole, morpholine, methylmorpholine, ethylmorpholine, aminoethylmorpholine, pyrrolidine, aminopyrrolidine, aminomethylpyrrolidine, aminoethylpyrrolidine, aminopropylpyrrolidine, hydroxypyrrolidine, hydroxymethylpyrrolidine, piperidine, aminomethylpiperidine, aminoethylpiperidine, aminopiperidine, hydroxypiperidine, methylpiperidine, dimethylpiperidine, piperidinemethanol and piperidineethanol.

Examples of the nitrogen-containing compound preferably used in the present invention further include compounds represented by the following formulas (b1) to (b4):

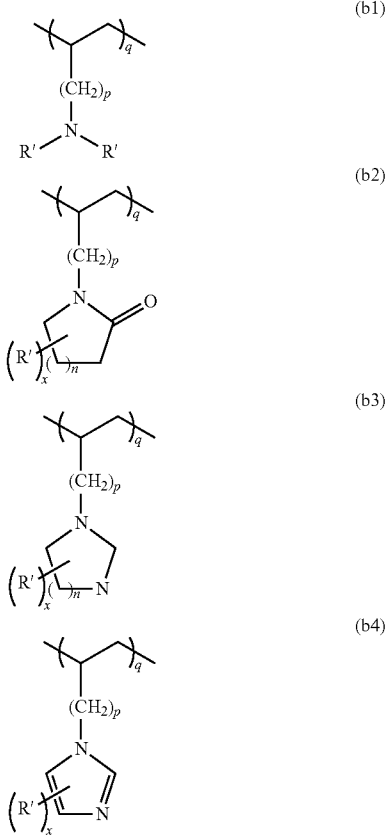

in which R', x and n are the same as those described above; p is 0 to 2; and q is 1 to 10000, preferably 1 to 1000.

The compounds represented by the formulas (b1) to (b4) are polymers having the above compounds of the formula (1) as the side chains. In view of availability, preferred examples of the polymer include: polyvinylamine, polyvinylimidazole, polyallylamine, polydiallylamine and poly(allylamine-co-diallylamine).

Preferred examples of the nitrogen-containing compound represented by the formula (3) include polyethyleneimine.

Those nitrogen-containing compounds may be used in combination of two or more, if necessary.

The composition according to the present invention contains the nitrogen-containing compound in an amount of preferably 50 to 100000 ppm, more preferably 50 to 50000 ppm, most preferably 50 to 20000 ppm, based on the total weight of the composition, so that surface roughness of the resist can be improved to the utmost under the condition where the pattern shape is kept good. Further, if the content of the nitrogen-containing compound is within the above range, the resist pattern is thickened enough and consequently space of the pattern is miniaturized.

The nitrogen-containing compound preferably has basicity. In other words, when the compound is dissolved in pure water, the solution is preferably basic. If showing acidity when dissolved in pure water, the nitrogen-containing compound may provide little effect of improving LER. This must be paid attention to if the compound is used in the composition of the present invention.

(B) Anionic Surfactant

The anionic surfactant used in the present invention has a sulfo or carboxyl group. As long as having a sulfo or carboxyl group, this surfactant may have other anionic hydrophilic groups. In the present invention, the "sulfo" means not only —SO$_3$H group but also —SO$_3^-$ sulfonate group. Also, the "carboxyl" means not only —COOH group but also —COO$^-$ carboxylate group. This means that, even if a —SO$_3$H or —COOH group in the surfactant reacts with a base such as a metal, the surfactant is considered to still have a sulfo or carboxyl group, respectively.

There are many known anionic surfactants having sulfo or carboxyl groups, and any of them can be used in the present invention. Examples thereof include: alkylsulfonic acids, alkylarylsulfonic acids, alkylcarboxylic acids, alkylarylcarboxylic acids, sodium salts thereof, potassium salts thereof, ammonium salts thereof, and amine salts thereof. Each of those surfactants may contain two or more sulfo or carboxyl groups in one molecule. Further, alkyl groups contained in those surfactants may have substituent groups as long as they function as hydrophobic groups of the surfactants. For example, methylene in the alkyl group may be partly replaced with an ether bond, and the alkyl group may have an unsaturated bond-containing group, such as, vinyl group. Further, hydrogens in the alkyl group may be all or partly replaced with halogen atoms, such as, fluorine. Examples of that anionic surfactant include: dodecylsulfonic acid, laurylsulfonic acid, dodecylbenzenesulfonic acid, polyoxyethylene lauryl ether sulfonic acid, lauric acid, sodium salts thereof, potassium salts thereof, and triethanolamine salts thereof. Among them, surfactants having sulfo groups are preferred because they tend to make the effect of the present invention appear remarkably.

The above surfactants can be used in combination of two or more. Some commercially available anionic surfactants are mixtures of the above, and they can be directly employed. Examples thereof include: alkylsulfonic acid mixtures, alkylbenzenesulfonic acid mixtures, sodium alkylnaphthalenesulfonate mixtures, sodium dialkylsulfosuccinate mixtures, sodium alkyl diphenyl ether disulfonate mixtures, sodium alkanesulfonate mixtures, and sodium alpha olefin sulfonate mixtures.

The surfactant used in the present invention may have not only sulfo group but also other anionic groups, such as, phosphate group, unless they impair the effect of the invention.

The composition of the present invention contains the surfactant in an amount of preferably 50 to 100000 ppm, more preferably 50 to 50000 ppm, most preferably 50 to 20000 ppm, based on the total weight of the composition, so that surface roughness of the resist can be improved to the utmost.

(C) Water

In addition to the above sulfonic acid and surfactant, the composition according to the present invention contains water as a solvent. Before used in the composition, water is preferably subjected to purification, such as, distillation, ion-exchange treatment, filtration and various adsorption treatments, so as to remove organic impurities, metal ions and the like. It is particularly preferred to adopt pure water.

(D) Other Additives

According to necessity, the composition of the present invention may further contain other additives, such as, acid, base and organic solvent.

The acid or base is employed for the purposes of controlling the pH of the composition and of improving solubility of each component. The acid or base can be freely selected as long as it does not impair the effect of the invention. For example, carboxylic acids, amines and ammonium salts are employable. Those acids and bases include aliphatic acids, aromatic acids, primary amines, secondary amines, tertiary amines and ammonium compounds. They are substituted or not substituted with any substituents. Examples thereof include: formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine, and tetramethylammonium.

The composition of the present invention may contain an organic solvent, as well as water, as a co-solvent. The organic solvent has a function of controlling the surface tension of the composition, and further often improves the wettability to the resist surface. The organic solvent usable for the above purposes is selected from organic solvents soluble in water. Examples thereof include: alcohols, such as, methyl alcohol, ethyl alcohol, isopropyl alcohol, and t-butyl alcohol; glycols, such as, ethylene glycol and diethylene glycol; ketones, such as, acetone and methyl ethyl ketone; esters, such as, methyl acetate, ethyl acetate and ethyl lactate; dimethylformamide, dimethyl sulfoxide, methyl cellosolve, cellosolve, butyl cellosolve, cellosolve acetate, alkylcellosolve acetate, propyleneglycol alkyl ethers, propyleneglycol alkyl ether acetate, butyl carbitol, carbitol acetate, and tetrahydrofuran.

However, hence those organic solvents may dissolve or denature the resist which is forming the pattern, they must be added only in small amounts if used. Specifically, the amount of the organic solvent is normally 50% or less, preferably 5% or less, more preferably 0.1% or less, based on the total weight of the composition. In order to prevent the resist from being dissolved or denatured, the organic solvent is preferably not used at all.

The composition according to the present invention may further contain germicide, antibacterial agent, preservative, and/or anti-mold agent. Those chemicals are added for the purpose of preventing bacteria or fungi from propagating in the composition with the passage of time. Examples thereof include alcohols, such as phenoxyethanol, and isothiazolone. Specifically, for example, Bestcide ([trademark], manufactured by Nippon Soda Co., Ltd.) can serve as particularly effective preservative, anti-mold agent or germicide. Those chemicals typically give no effect to the function of the composition, and are contained in an amount of normally 1% or less, preferably 0.1% or less, more preferably 0.001% or less, based on the total weight of the composition.

[Pattern Formation Method]

The pattern formation method according to the present invention will be described below. The lithographic process in this method may be any of conventional processes for forming resist patterns from known positive- or negative-type photosensitive resin compositions. The following is a typical pattern formation method in which the composition of the present invention is employed.

First, a photosensitive resin composition is applied on a surface, which may be pretreated if necessary, of a substrate, such as a silicon or glass substrate, according to a known coating method such as spin-coating method, to form a photosensitive resin layer. Prior to applying the photosensitive resin composition, an antireflective coat may be beforehand formed thereunder on the substrate surface. The antireflective coat makes it possible to improve the sectional shape and the exposure margin. In another way, after the photosensitive resin layer is formed, the antireflective coat may be formed thereon.

In the pattern formation method according to the present invention, any known photosensitive resin composition can be adopted. Typical examples of the photosensitive resin composition employable in the pattern formation method of the present invention are as follows: positive type compositions, such as, a composition comprising a quinonediazide photosensitizer and an alkali-soluble resin, and a chemically amplified photosensitive resin composition; and negative type compositions, such as, a composition containing a polymer compound having photosensitive groups (e.g., polycinnamic acid vinyl), a composition containing an aromatic azide compound, a composition containing an azide compound (e.g., cyclized rubber-bisazide compound), a compound containing a diazo resin, a photopolymerizable composition containing an addition polymerizable unsaturated compound, and a chemically amplified negative type photosensitive resin composition.

In the positive type composition comprising a quinonediazide photosensitizer and an alkali-soluble resin, the quinonediazide photosensitizer is, for example, 1,2-benzquinnediazide-4-sulfnic acid, 1,2-benzoquinonediazide-4-sulfonic acid, 1,2-naphthoquinonediazide-4-sulfonic acid, 1,2-naphthoquinonediazide-5-sulfonic acid, or an ester or amide thereof. Examples of the alkali-soluble resin include novolac resin, polyvinylphenol, polyvinyl alcohol, and copolymers of acrylic and methacrylic acid. The novolac resin is preferably produced from one or more phenols, such as, phenol, o-cresol, m-cresol, p-cresol and xylenol, in combination with one or more aldehydes, such as, formamide and paraformamide.

Any chemically amplified photosensitive resin composition, such as, a positive type one or a negative type one, can be employed in the pattern formation method of the present invention. The chemically amplified resist generates an acid when exposed to radiation, and the acid serves as a catalyst to promote chemical reaction by which solubility to the developing solution is changed within the areas irradiated to form a pattern. For example, the chemically amplified resist composition comprises an acid-generating compound, which generates an acid when exposed to radiation, and an acid-sensitive functional group-containing resin, which decomposes in the presence of acid to form an alkali-soluble group such as phenolic hydroxyl or carboxyl group, an alkali-soluble resin, a crosslinking agent and an acid-generating compound.

The photosensitive resin composition layer formed on the substrate is then prebaked, for example, on a hot plate to remove the solvent contained in the composition, so as to form a resist layer having a thickness of normally about 0.03 to 10 μm. The prebaking temperature depends on the substrate and the solvent, but is normally 20 to 200° C., preferably 50 to 150° C.

The resist layer is then subjected to exposure through a mask, if necessary, by means of known exposure apparatus such as a high-pressure mercury lamp, a metal halide lamp, an ultra-high pressure mercury lamp, a KrF excimer laser equipment, an ArF excimer laser equipment, a soft X-ray irradiation system, and an electron beam lithography system.

After the exposure, baking is carried out, if necessary. Subsequently, development such as puddle development is carried out to form a resist pattern. The resist is normally developed with an alkali developer, which is, for example, an aqueous solution of potassium hydroxide or tetramethylammonium hydroxide (TMAH). After the development, the resist pattern is rinsed (washed) with a rinse solution. The thus formed pattern is adopted as a resist for etching, plating, ion diffusion or dyeing, and thereafter peeled away, if necessary.

The pattern formation method of the present invention effectively improves pattern collapse and melting of, particularly, a fine resist pattern having a high aspect ratio. Here, the "aspect ratio" means the ratio of height to width in the resist pattern. Accordingly, the method of the present invention is preferably combined with a lithographic process for forming a fine resist pattern, namely, with a lithographic process including exposure to X-rays, electron beams or light of 250 nm or less emitted from a light source such as a KrF excimer laser or an ArF excimer laser. As for the pattern dimension, the method is preferably combined with a lithographic process for forming a resist pattern in which the line width of space in a line-and-space pattern or the hole diameter in a contact hole pattern is 300 nm or less, particularly 50 nm or less.

In the method of the present invention, the resist pattern can be treated with a rinse solution after development, if necessary. There are no particular restrictions on how long the resist pattern is in contact with the rinse solution, namely, on the treatment time. However, the treatment time is generally 1 second or more to obtain the effect of the present invention. There are also no particular restrictions on how to bring the resist pattern in contact with the rinse solution. For example, the resist pattern may be immersed in the rinse solution. In another way, while the resist pattern is made to keep spinning, the rinse solution may be dropped, sprayed or blown onto the surface thereof.

After the development in the method of the present invention, the resist pattern can be washed with pure water before and/or after treated with a rinse solution. The washing treatment before rinsing is carried out for the purpose of washing away the developer attached on the pattern surface, and that after rinsing is for washing away the rinse solution. There are no particular restrictions on the method of washing with pure water. For example, the resist pattern may be immersed in pure water. In another way, while the resist pattern is made to keep spinning, pure water may be dropped, sprayed or blown onto the surface thereof. The washing treatment with pure water can be carried out either before or after, or otherwise both before and after the rinse treatment.

After the development, the resist pattern treated with a rinse solution and/or pure water, if necessary, is then dried. For example, the resist pattern is rotated at a high speed with a spin-coater, heated on a hot plate, or left to stand in vacuum or in air.

Thereafter, the dried resist pattern is surface-treated with the resist pattern treatment composition according to the present invention. In this treatment, the surface of the resist pattern is brought into contact with the composition and then dried. The method for applying the composition may be the same as that for applying the rinse solution described above. The resist pattern treated with the composition is then dried, if necessary.

It is noted here that the resist pattern treatment composition of the present invention is generally applied to a dried resist pattern. Accordingly, the composition of the present invention is very different from a rinse solution, which is applied to a wet resist pattern. The rinse solution is required to remove a developer or the like without causing troubles such as pattern collapse. On the other hand, the resist pattern treatment composition is generally applied to a resist pattern beforehand treated with a rinse solution or pure water and then dried, and accordingly hardly causes pattern collapse. The resist pattern treatment composition and pattern formation method according to the present invention thus make it possible to improve surface roughness of a resist pattern subjected to the treatments without impairing the shape thereof, and further make it also possible to miniaturize the pattern The present invention is further explained by use of the following Examples, but they by no means restrict embodiments of the present invention.

Comparative Example A01

A silicon wafer beforehand treated with hexamethyldisilazane was coated with an extreme UV-sensitive resin composition by means of a spin-coater (manufactured by Tokyo Electron Ltd.), and then dried on a hot-plate at 130° C. for 60 seconds to form a resist layer of 50 nm thickness. Subsequently, the resist layer was exposed to light through an exposure mask (line/space=1/1) by means of an extreme UV exposure apparatus under the conditions of exposure wavelength=13.5 nm and numerical aperture NA=0.3. After exposed to light, the resist layer was heated on a hot-plate at 100° C. for 60 seconds and then paddle-developed with 2.38 wt % aqueous solution of tetramethylammonium hydroxide for 30 seconds. The developed resist layer was washed with pure water and then dried to obtain a 1:1 line-and-space resist pattern of 30 nm line width. In this way, a resist pattern of Comparative example A01 was prepared. The pattern of Comparative example A01 was observed with a critical dimension-scanning electron microscope (CD-SEM CG4000 [trademark], manufactured by Hitachi High-Technologies Corporation), to evaluate LER. In this example, LER was evaluated in terms of LER improvement rate, which is a ratio of the LER after to before the treatment. If the LER improvement rate is 5% or more, LER improvement can be said to be sufficient.

The section of the pattern was also observed with a field-emission scanning electron microscope (S-5500 [trademark], manufactured by Hitachi High-Technologies Corporation), to evaluate the pattern shape. If the section was observed to be changed considerably by the treatment, the pattern shape was judged to be poor.

Example A01 to A03

Hexadecylsulfonic acid and i-butylamine were dissolved in pure water in concentrations shown in Table 1, to prepare each resist pattern treatment composition. The composition was applied on the pattern surface of Comparative example A01 by means of a spin-coater, and then heated at 90° C. for 60 seconds. The line width of the obtained pattern was measured with the above critical dimension-scanning electron microscope, and it was calculated how much the line dimension increased from the pattern of Comparative example A01. Further, the LER and pattern shape were evaluated in the same manner as those in Comparative example A01. The results were shown in Table 1.

TABLE 1

| | Composition | | | | Evaluation | | | | |
|---|---|---|---|---|---|---|---|---|---|
| | surfactant | | amine | | increased amount of line dimension (nm) | LER (nm) | improved amount of LER (nm) | LER improvement rate (%) | pattern shape |
| | compound | conc. (ppm) | compound | conc. (ppm) | | | | | |
| Com. A01 | — | — | — | — | — | 7.4 | — | — | good |
| Ex. A01 | HDS*[1] | 200 | i-butylamine | 200 | 1.5 | 6.7 | 0.7 | 9 | good |
| Ex. A02 | HDS | 500 | i-butylamine | 500 | 1.9 | 6.2 | 1.2 | 16 | good |
| Ex. A03 | HDS | 1000 | i-butylamine | 1000 | 2.8 | 6.5 | 0.9 | 12 | good |

Remarks:
*[1] hexadecylsulfonic acid

Comparative Examples B01 to B07 and Examples B01 to B04

The procedure of Example A02 was repeated except for changing the surfactant into those shown in Table 2, to carry out Comparative examples B01 to B07 and Examples B01 to B04. The results are shown in Table 2. The pattern shapes of Comparative examples B03 to B07 were observed to have defects in the upper parts.

TABLE 2

| | Composition | | | | Evaluation | | | | |
|---|---|---|---|---|---|---|---|---|---|
| | surfactant | | amine | | increased amount of line dimension (nm) | LER (nm) | improved amount of LER (nm) | LER improvement rate (%) | pattern shape |
| | compound | conc. (ppm) | compound | conc. (ppm) | | | | | |
| Com. B01 | — | — | — | — | — | 7.4 | — | — | good |
| Com. B02 | — | — | i-butylamine | 500 | −2.6 | 7.2 | 0.2 | 3 | good |
| Com. B03 | S-1*[2] | 500 | i-butylamine | 500 | 1.5 | 6.7 | 0.7 | 9 | poor |
| Com. B04 | S-2*[2] | 500 | i-butylamine | 500 | 1.2 | 7.0 | 0.4 | 5 | poor |
| Com. B05 | S-3*[2] | 500 | i-butylamine | 500 | 2.1 | 6.7 | 0.7 | 9 | poor |
| Com B06 | S-4*[2] | 500 | i-butylamine | 500 | 2.6 | 6.8 | 0.6 | 8 | poor |
| Com. B07 | S-5*[2] | 500 | i-butylamine | 500 | 0.6 | 7.2 | 0.2 | 3 | poor |
| Ex. B01 | ASM*[3] | 500 | i-butylamine | 500 | 2.4 | 6.1 | 1.3 | 18 | good |
| Ex. B02 | DBS*[4] | 500 | i-butylamine | 500 | 2.1 | 6.1 | 1.3 | 18 | good |
| Ex. B03 | ABSM*[5] | 500 | i-butylamine | 500 | 1.9 | 6.4 | 1.0 | 14 | good |
| Ex. B04 | LATEA*[6] | 500 | i-butylamine | 500 | 1.2 | 6.9 | 0.5 | 7 | good |

Remarks:
*[2] nonionic surfactants represented by the following formulas:

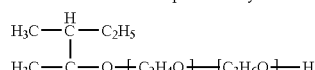

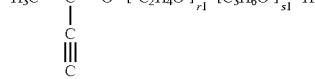

(S-1)

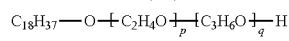

(S-2)

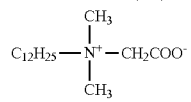

(S-3)

TABLE 2-continued

|  | Composition | | | | Evaluation | | | | |
| --- | --- | --- | --- | --- | --- | --- | --- | --- | --- |
| | surfactant | | amine | | increased amount of line dimension (nm) | LER (nm) | improved amount of LER (nm) | LER improvement rate (%) | pattern shape |
| | compound | conc. (ppm) | compound | conc. (ppm) | | | | | |

$$C_{11}H_{23}CONHC_3H_6 - \overset{CH_3}{\underset{CH_3}{N^+}} - CH_2COO^-$$

(S-4)

$$\left[ C_{18}H_{37} - \overset{CH_3}{\underset{CH_3}{N^+}} - CH_3 \right] Cl^-$$

(S-5)

in which r1, s1, r2 and s2 are integers satisfying the conditions of r1 + r2 = 5 and s1 + s2 = 2, respectively;
*³alkylsulfonic acid mixture, specifically, mixture of saturated aliphatic sulfonic acids having 12 to 18 carbon atoms;
*⁴dodecylbenzenesulfonic acid;
*⁵alkylbenzenesulfonic acid mixture, specifically, mixture of alkylbenzenesulfonic acids having 12 to 18 carbon atoms; and
*⁶triethanolamine laurate.

Comparative Examples C01 to C03 and Examples C01 to C15

The procedure of Example A01 was repeated except for changing the amine into those shown in Table 3, to carry out Comparative examples C01 to C03 and Examples C01 to C15. The results are shown in Table 3.

Comparative Example D01 and Examples D01 and D02

The procedure of Example A01 was repeated except for changing the amine and the amount thereof into those shown in Table 4, to prepare resist pattern treatment compositions. Each of the compositions was applied on the pattern surface with a spin-coater, then heated at 110° C. for 60 seconds, subsequently washed with pure water, and finally dried. The thus obtained patterns were evaluated in the same manner as in Example A01. The results are shown in Table 4.

TABLE 3

| | Composition | | | | Evaluation | | | | |
| --- | --- | --- | --- | --- | --- | --- | --- | --- | --- |
| | surfactant | | amine | | increased amount of line dimension (nm) | LER (nm) | improved amount of LER (nm) | LER improvement rate (%) | pattern shape |
| | compound | conc. (ppm) | compound | conc. (ppm) | | | | | |
| Com. C01 | — | — | — | — | — | 7.4 | — | — | good |
| Com. C02 | HDS | 200 | — | — | −1.0 | 7.2 | 0.2 | 3 | good |
| Com. C03 | HDS | 200 | 2-aminoethanesulfonic acid (acidic) | 200 | −0.9 | 7.0 | 0.4 | 5 | good |
| Ex. C01 | HDS | 200 | triethylamine | 200 | 2.1 | 6.1 | 1.3 | 18 | good |
| Ex. C02 | HDS | 200 | tri-n-propylamine | 200 | 1.8 | 6.3 | 1.1 | 15 | good |
| Ex. C03 | HDS | 200 | di-i-butylamine | 200 | 1.5 | 6.0 | 1.4 | 19 | good |
| Ex. C04 | HDS | 200 | cyclohexylamine | 200 | 0.7 | 6.2 | 1.2 | 16 | good |
| Ex. C05 | HDS | 200 | N,N,N',N'-tetramethylethylenediamine | 200 | 0.5 | 5.9 | 1.5 | 20 | good |
| Ex. C06 | HDS | 200 | ethylenediamine | 200 | 0.8 | 6.0 | 1.4 | 19 | good |
| Ex. C07 | HDS | 200 | piperazine | 200 | 1.2 | 6.1 | 1.3 | 18 | good |
| Ex. C08 | HDS | 200 | monoethanolamine | 200 | 1.8 | 5.2 | 1.2 | 16 | good |
| Ex. C09 | HDS | 200 | n-propylamine | 200 | 1.2 | 6.2 | 1.2 | 16 | good |
| Ex. C10 | HDS | 200 | n-pentylamine | 200 | 2.0 | 6.4 | 1.0 | 14 | good |
| Ex. C11 | HDS | 200 | piperizine | 200 | 0.9 | 6.3 | 1.1 | 15 | good |
| Ex. C12 | HDS | 200 | diethanolamine | 200 | 1.5 | 6.4 | 1.0 | 14 | good |
| Ex. C13 | HDS | 200 | triethanolamine | 200 | 1.7 | 6.1 | 1.3 | 18 | good |
| Ex. C14 | HDS | 200 | N,N-diethylaminoethylamine | 200 | 1.2 | 6.0 | 1.4 | 19 | good |
| Ex. C15 | HDS | 200 | N,N,N',N'-tetraethylethylenediamine | 200 | 0.7 | 5.9 | 1.5 | 20 | good |

TABLE 4

| | Composition | | | | Evaluation | | | |
| --- | --- | --- | --- | --- | --- | --- | --- | --- |
| | surfactant | | amine | | increased amount of | | improved amount of | LER improvement rate (%) | pattern shape |
| | compound | conc. (ppm) | compound | conc. (ppm) | line dimension (nm) | LER (nm) | LER (nm) | | |
| Com. D01 | — | — | — | — | — | 7.4 | — | — | good |
| Ex. D01 | HDS | 200 | polyallylamine | 2000 | 5.5 | 6.3 | 1.1 | 15 | good |
| Ex. D02 | HDS | 200 | polyvinylimidazole | 2000 | 6.3 | 6.6 | 0.8 | 11 | good |

The invention claimed is:

1. A resist pattern treatment composition comprising:
   (A) a nitrogen-containing compound showing basicity when dissolved in water and having a boiling point of 48° C. or more, and said nitrogen-containing compound is selected from the group consisting of: polyvinylamine, polyvinylimidazole, polyallylamine, polydiallylamine, poly(allylamine-co-diallylamine) and polyethyleneimine;
   (B) an anionic surfactant having a sulfo or carboxyl group, and
   (C) water.

2. The resist pattern treatment composition according to claim 1, wherein said nitrogen-containing compound is selected from the group consisting of: polyvinylamine, polyvinylimidazole, polyallylamine, polydiallylamine and poly(allylamine-co-diallylamine).

3. The resist pattern treatment composition according to claim 1, wherein said nitrogen-containing compound is polyethyleneimine.

4. The resist pattern treatment composition according to claim 1, wherein said nitrogen-containing compound is contained in an amount of 50 to 100,000 ppm based on the total weight of the composition.

5. The resist pattern treatment composition according to claim 1, wherein said anionic surfactant is selected from the group consisting of: alkylsulfonic acids, alkylarylsulfonic acids, sodium salts thereof, potassium salts thereof, ammonium salts thereof, and amine salts thereof.

6. The resist pattern treatment composition according to claim 5, wherein said anionic surfactant is contained in an amount of 50 to 100,000 ppm based on the total weight of the composition.

7. The resist pattern treatment composition according to claim 6, further comprising additive at least one selected from acid, base and organic solvent.

8. The resist pattern treatment composition according to claim 7, wherein the additive is selected from the group consisting of formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine and tetramethylammonium.

9. The resist pattern treatment composition according to claim 7, wherein the additive is an organic solvent selected from the group consisting of methyl alcohol, ethyl alcohol, isopropyl alcohol, t-butyl alcohol, ethylene glycol, diethylene glycol, acetone, methyl ethyl ketone, methyl acetate, ethyl acetate, ethyl lactate, dimethylformamide, dimethyl sulfoxide, methyl cellosolve, cellosolve, butyl cellosolve, cellosolve acetate, alkylcellosolve acetate, propyleneglycol alkyl ethers, propyleneglycol alkyl ether acetate, butyl carbitol, carbitol acetate, and tetrahydrofuran.

10. The resist pattern treatment composition according to claim 9, wherein the amount of the organic solvent is 5 percent or less, based on the total weight of the composition.

11. The resist pattern treatment composition according to claim 9, wherein the amount of the organic solvent is 0.1 percent or less, based on the total weight of the composition.

12. The resist pattern treatment composition according to claim 6, further comprising chemicals selected from the group consisting of germicide, antibacterial agent, preservative, anti-mold agent, and any combination of any of these, wherein the amount of chemicals is 1 percent or less based on the total weight of the composition.

13. The resist pattern treatment composition according to claim 6, further comprising chemicals selected from the group consisting of germicide, antibacterial agent, preservative, anti-mold agent, and any combination of any of these, wherein the amount of chemicals is 0.001 percent or less based on the total weight of the composition.

14. A pattern formation method comprising the steps of:
   (1) coating a substrate with a photosensitive resin composition to form a photosensitive resin composition layer,
   (2) exposing said photosensitive resin composition layer,
   (3) developing the exposed photosensitive resin composition layer with a developer, and
   treating the surface of the resist pattern with the composition according to claim 1.

* * * * *